United States Patent [19]

Waddington

[11] 4,107,585

[45] Aug. 15, 1978

[54] CONTROL DEVICES

[75] Inventor: Damer Evelyn O'Neill Waddington, St. Albans, England

[73] Assignee: Marconi Instruments Ltd., England

[21] Appl. No.: 778,312

[22] Filed: Mar. 16, 1977

[51] Int. Cl.² .............................................. H02K 27/20
[52] U.S. Cl. ............................. 318/331; 318/345 AB; 318/457
[58] Field of Search ........ 318/331, 317, 347, 345 AB, 318/345 CA, 343, 457

[56] References Cited

U.S. PATENT DOCUMENTS 3,488,756  1/1970  Skrivanek, Jr. ...................... 318/331

Primary Examiner—Herman J. Hohauser

[57] ABSTRACT

A control device which is suitable for use with electronic apparatus is used to scan a range of signal or data values, such as a frequency spectrum, and to cease scanning when a selected parameter is found. The scanning operation is driven by a d.c. ironless motor which, once it has been initially spun by hand, continues to rotate until the selected parameter is detected.

5 Claims, 1 Drawing Figure

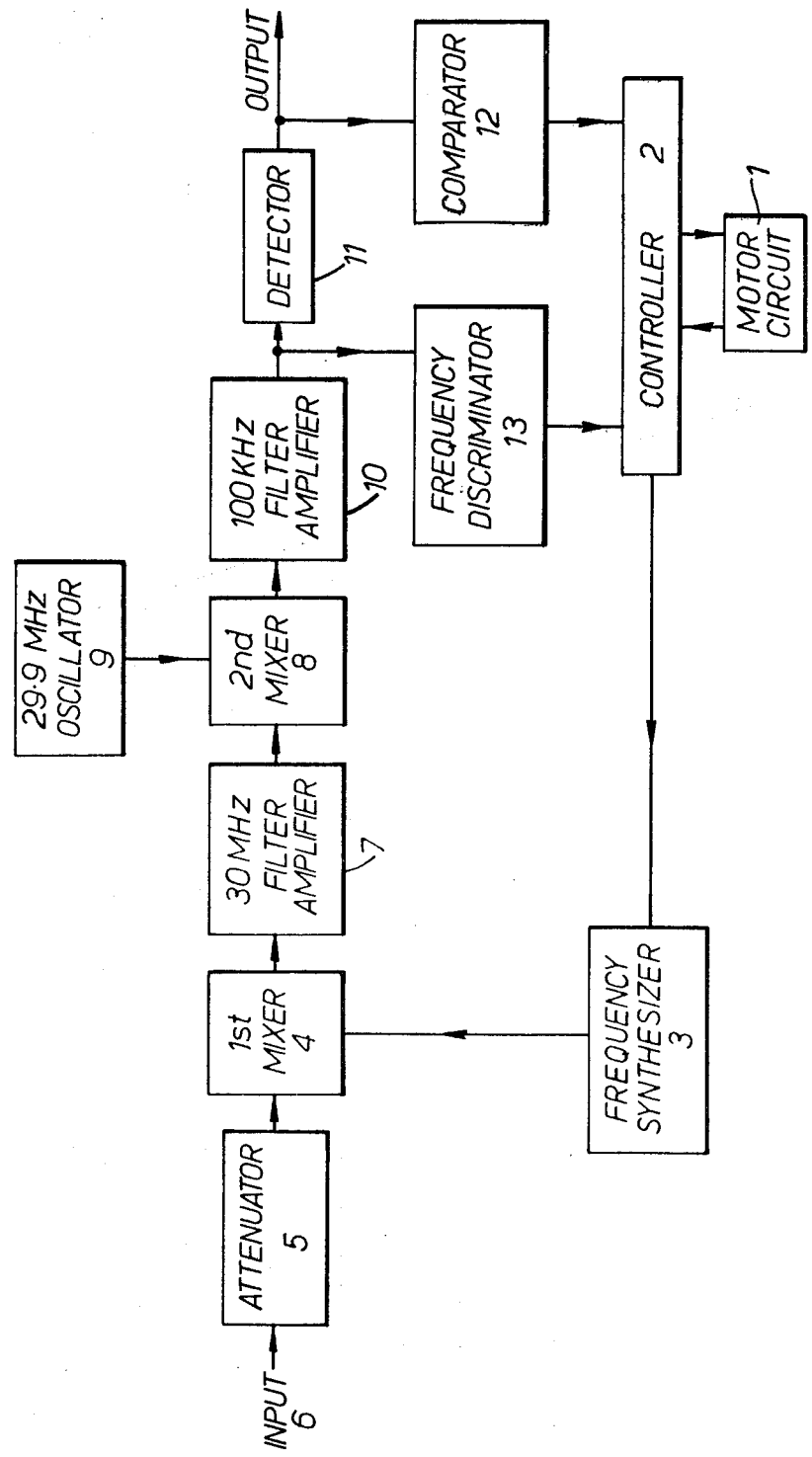

CONTROL DEVICES

This invention relates to control devices.

According to this invention, a control device suitable for an electronic apparatus includes means whereby rotation can be imparted to a rotational member which is coupled to a d.c. ironless motor, means for driving from the back e.m.f. generated by the motor when it is turned a driving signal which is used to continue the rotation of the rotatable member to simulate an inertial effect, and means coupled to the rotational member for scanning a range of signal or data values, and means for detecting a selected parameter of said range of values and which is arranged to stop rotation of said member upon detection of the selected parameter.

Preferably, a manually operable knob is provided for imparting rotational motion to the d.c. ironless motor.

Preferably, the range of signal or data values comprises a frequency spectrum, and the selected parameter represents the amplitude of a particular frequency. Consequently the control device scans a range of frequencies until a frequency having an amplitude satisfying certain requirements is detected.

Preferably, the rotational member is stopped when a frequency having an amplitude above a threshold value is detected.

The invention is further described, by way of example, with reference to the accompanying drawing which shows a frequency detector circuit including a control device in accordance with the present invention.

Referring to the drawing, a frequency detector circuit is used to scan a spectrum of frequencies and to detect frequency components having an amplitude greater than a threshold value. Such circuits are used in certain kinds of test equipment, and the spectrum of frequencies in this invention is scanned under the action of a control device in accordance with our co-pending application Ser. No. 778,256, filed Mar. 16, 1977. In the co-pending application, a control device includes means for maintaining rotation of a control knob, once it has been initially spun manually. The speed of rotation may be allowed to decay rapidly, or it may be maintained for a long time, depending on the characteristics built into the control device. When such a control device is used with the present circuit, the circuit continues to scan the spectrum of frequencies until the knob is stopped manually, or its speed is allowed to decay naturally, unless a frequency is detected having a particular characteristic, in this case an amplitude above a threshold value. When a detection takes place the circuit shown in FIG. 1 stops the rotation of the control knob, to cease the scanning of the spectrum of frequencies so that an operator can examine the detected frequency in detail.

Referring to the drawing a greater detail, a d.c. ironless motor 1 is connected to a controller 2, which in turn feeds a frequency synthesizer to produce a signal having a variable frequency which is mixed in mixer 4 with a signal received, via an attenuator 5 which is used to set the sensitivity of the system, from a frequency source (not shown) under test connected to terminal 6.

The source connected to terminal 6 provides the frequency spectrum to be examined, and all frequency components in this spectrum are mixed with the variable frequency from the frequency synthesizer 3. Typically the source contains components up to 20MHz and the frequency synthesizer generates frequencies in the range 30MHz to 50MHz. The difference frequency resulting from the mixing process is selected by the 30MHz filter/amplifier 7 the output of which is mixed in the second mixer 8 with the fixed frequency of 29.9MHz generated by the oscillator 9. The resultant difference frequency of 100KHz is selected by the 100KHz filter/amplified 10.

The output from the 100KHz filter/amplifier 10 is fed to the detector 11 which feeds the rectified signal to the output and to the voltage comparator 12. When this signal exceeds a preset threshold level a signal is sent from the comparator 12 to the controller 2 which stops the rotation of the motor 1, by for example applying a stop signal to the external stop terminal described in the parent application.

To ensure accuracy, the 100KHz filter/amplifier 10 is connected to a frequency discriminator 13 which detects when the final frequency difference is above or below 100KHz exactly. The frequency discriminator is conventional and so is not described in greater detail. When a signal is found to have an amplitude greater than the threshold level a feedback signal is passed from the discriminator 13 via the controller 2 to the synthesizer 3 to bring the signal to 100KHz with an error less than or equal to the smallest frequency increment available from the frequency synthesizer 3. This permits a fine control and allows for overshoot when the spectrum of frequencies is rapidly scanned. Thus the amplitude of a signal exceeding threshold is available at the output and its frequency can be calculated by a knowledge of the frequency provided by the synthesizer 3.

The rotation of the motor 1 can be used to generate directly digital pulses which are applied via the controller 2 to the synthesizer 3 to step up the variable frequency generated so long as the rotation continues, and at a rate which is dependent on the speed of rotation. The generation of digital control pulses in this way is described in our co-pending patent application Ser. No. 778,256, filed Mar. 16, 1977.

I claim:

1. A control device suitable for an electronic apparatus and including means whereby rotation can be imparted to a rotational member of a d.c. ironless motor, means for driving from the back e.m.f. generated by the motor when it is turned a driving signal which is used to continue the rotation of the rotatable member to simulate an inertial effect and means coupled to the rotational member for scanning a range of signal or data values, and means for detecting a selected parameter of said range of values and which is arranged to stop rotation of said member upon detection of the selected parameter.

2. A control device as claimed in claim 1 and wherein the range of signal or data values comprises a frequency spectrum, and the selected parameter represents the amplitude of a particular frequency.

3. A control device as claimed in claim 2 and wherein the rotational member is stopped when a frequency having an amplitude above a threshold value is detected.

4. A control system comprising, in combination:
   a d.c. ironless motor having a rotatable member which generates back e.m.f. when rotated;
   a control member connected to said rotatable member for imparting rotation thereto in response to operator manipulation;

control signal means connected with the generated back e.m.f. for producing a control signal indicative of angular rotation of said rotatable member;

driving circuit means connected with the generated back e.m.f. for powering said motor to continue rotation of said rotatable member which is initiated by said control member;

scanning means coupled with said rotatable member for scanning a range of signal or data values; and output means connected between said scanning means and said driving circuit means for terminating rotation of said rotatable member when said scanning means has reached a desred value.

5. A control system as defined in claim 4 wherein said scanning means comprises a frequency synthesizer.

* * * * *

UNITED STATES PATENT AND TRADEMARK OFFICE
CERTIFICATE OF CORRECTION

PATENT NO. : 4,107,585
DATED : August 15, 1978
INVENTOR(S) : Damer Evelyn O'Neill Waddington It is certified that error appears in the above-identified patent and that said Letters Patent are hereby corrected as shown below:

On the Title page insert:

---[30] Foreign Application Priority Data
  Great Britain No. 10887/76 of March 18, 1976---

Signed and Sealed this

Sixth Day of February 1979

[SEAL]

Attest:

RUTH C. MASON
*Attesting Officer*

DONALD W. BANNER
*Commissioner of Patents and Trademarks*